United States Patent
Clube

(10) Patent No.: US 6,657,756 B2
(45) Date of Patent: Dec. 2, 2003

(54) METHOD AND APPARATUS FOR INCREASING THE EFFECTIVE EFFICIENCY OF HOLOGRAMS

(75) Inventor: Francis Stace Murray Clube, Chemin des Ribaudes (CH)

(73) Assignee: Holtronic Technologies Plc, London (GB)

( * ) Notice: Subject to any disclaimer, the term of this patent is extended or adjusted under 35 U.S.C. 154(b) by 75 days.

(21) Appl. No.: 10/066,728

(22) Filed: Feb. 6, 2002

(65) Prior Publication Data

US 2002/0135833 A1 Sep. 26, 2002

(51) Int. Cl.[7] .................................................. G03H 1/00
(52) U.S. Cl. ............................ 359/32; 359/12; 359/900; 359/197; 430/2; 430/311; 430/397; 356/505
(58) Field of Search .............................. 359/32, 22, 34, 359/12, 900, 197, 222; 430/1, 2, 311, 397, 396; 356/505, 632

(56) References Cited

U.S. PATENT DOCUMENTS

| | | | |
|---|---|---|---|
| 4,857,425 A | * | 8/1989 | Phillips ........................ 430/1 |
| 4,966,428 A | * | 10/1990 | Phillips .......................... 359/9 |
| 6,005,666 A | * | 12/1999 | Dandliker et al. .......... 356/505 |

* cited by examiner

Primary Examiner—John Juba
Assistant Examiner—Fayez Assaf

(57) ABSTRACT

A method is disclosed for reconstructing an image from a total internal reflection hologram that includes the steps of arranging the hologram in relation to the first face of a coupling body, generating a substantially collimated illumination beam, directing the beam through a second face of the coupling body so that it reconstructs the image recorded in the hologram, recycling at least once the light in the illumination beam that is reflected from the hologram by redirecting it through the second face of the coupling body so that it also reconstructs the image recorded in the hologram, and scanning the illumination and recycled beams across the hologram, for the purpose of increasing the effective reconstruction efficiency of the total internal reflection hologram.

22 Claims, 8 Drawing Sheets

METHOD AND APPARATUS FOR INCREASING THE EFFECTIVE EFFICIENCY OF HOLOGRAMS

FIELD OF THE INVENTION

The present invention relates to a method and apparatus for reconstructing images from total internal reflection holograms and particularly for increasing the effective reconstruction efficiency of total internal reflection holograms.

BACKGROUND ART

The principles of total internal reflection (TIR) holography are described in U.S. Pat. No. 4,857,425 since which time many advances have been made to maximise the advantages of TIR holography when applied to microelectronics manufacturing. Other prior art references are U.S. Pats. Nos. 4,917,497, 4,966,428, 5,187,372, 5,640,257, 5,695,894 and European Patent Appl. No. 98303677.

U.S. Pat. No. 4,966,428 discloses an apparatus based on TIR holography for manufacturing integrated circuits wherein a holographic image formed in a first recording medium on a glass plate is replayed by scanning it with a narrow collimated beam of light so as to print the image into a second recording medium on a silicon wafer arranged in proximity and parallel to the first recording medium. A "zigzag" or raster scanning scheme is disclosed wherein the beam scans in lines of alternate direction with a partial overlap between successive scan lines whereby the complete holographic image recorded in the first recording medium is printed into the second recording medium. This scanning technique provides a uniform time-integrated illumination of the hologram and also maximises the power of the replay beam arriving at the hologram in order to minimise the replay time.

U.S. Pat. No. 5,695,894 discloses a TIR holographic system for changing the scale of a pattern reconstructed from a TIR hologram wherein a first computer controlled stage produces a raster scan of the illumination beam across the hologram while a second computer controlled stage simultaneously displaces a photoresist coated wafer relative to the hologram in orthogonal directions in the plane of the wafer. Changing the scale of the pattern printed from the hologram onto a wafer is important for a multi-level process in which a pattern has to be printed onto a wafer with a pattern already printed on it such that the two patterns are accurately registered, or aligned, with respect to each other. In such cases there may exist small differences in the corresponding dimensions of the respective patterns arising from, for example, an irreversible expansion of the wafer caused by a high-temperature, post-exposure treatment. To counteract this so that accurate overlay is achieved over the complete pattern, the difference in scale between the patterns on the wafer and in the hologram is first determined by measuring the relative positions of reference alignment marks included alongside the respective patterns and then the difference is compensated by providing a relative motion between the wafer and hologram as the illumination beam scans during the printing. Since this procedure produces some loss in resolution of printed image, U.S. Pat. No. 5,695,894 additionally teaches that an amount of convergence or divergence be introduced into the illumination beam so that the image instantaneously reconstructed from the hologram by the scanning beam is itself magnified or demagnified by the measured amount. For this purpose an apparatus is disclosed comprising a beam decollimator and a prism through which the beam passes before it illuminates the hologram. Adjustment of the separation of lenses in the beam decollimator changes the degree of convergence or divergence of the beam whereas the prism compresses the beam in one plane so that the magnification or demagnification of the image reconstructed from the hologram is rendered isotropic.

EP-A-0421645 discloses the combination of a raster scanning of the illumination beam in a TIR holographic system with a continuous measurement of the local separation of the hologram and wafer surfaces at the location of the beam as it scans and a continuous adjustment of that separation to the focal distance of the image reconstructed from the hologram in order that the image is accurately printed in focus on the wafer surface. This technique overcomes the problem caused by the unevenness of wafer surface and the limited depth-of-focus of high-resolution images.

European Patent Application No. 98303677 discloses an enhancement of the previous method to further improve the accuracy with which the image is printed in focus on the wafer surface wherein the dimension of the collimated illumination beam in the scanning direction is additionally compressed relative to its dimension in the stepping direction.

A further important consideration for the application of TIR holography to microelectronic manufacturing is the time it takes to print a pattern from a hologram onto a wafer or other substrate. Using the raster scan techniques described in the prior art, the time, t, it takes to print a pattern of length, l, and width, w, from a hologram onto a substrate can be estimated as:

$$t = \frac{lw}{vs} \qquad \text{equ. (1)}$$

where v is the scanning speed of the beam and s is the stepping distance between successive scan lines (for this estimation the time it takes for the beam to decelerate, step and then accelerate between scan lines has been neglected and the beam dimensions have been assumed to be negligible compared to the pattern size).

However, the scan speed and step size of the beam during the scanning also have to satisfy the condition:

$$E = \frac{\eta P}{vs} \qquad \text{equ. (2)}$$

where E is the exposure dose required by the photoresist, P is the power of the laser beam at the output of the laser and η is the efficiency, or transmission, of the complete optical system between the laser and the wafer surface.

From equs. (1) and (2) it therefore follows that:

$$t = \frac{lwE}{\eta P} \qquad \text{equ. (3)}$$

Evaluating this for a pattern of dimensions 30 cm×40 cm, a photoresist of sensitivity 100 mJ/cm², an argon laser of output power 2 W and an optical system efficiency of 50% produces:

$$t = \frac{30 \times 40 \times 0.1}{0.5 \times 2} = 120 \text{ s} = 2 \text{ minutes}$$

Although this is acceptable for industrial application it would be advantageous if it could be reduced.

It is clear from equ. (3) that the time it takes to print a pattern of certain dimensions may be reduced by any of i) increasing the sensitivity of the resist, ii) increasing the transmission of the optical system, and iii) increasing the laser power. However, i) is usually difficult because photoresists are generally mature and optimised products, ii) is difficult because of the properties of TIR holograms, and iii) although feasible, in that an additional or more powerful laser source can be added to the system, may be unattractive because of operating costs.

SUMMARY OF THE INVENTION

It is therefore an object of the present invention to provide a method and apparatus to reduce the time required to print an image from a total internal reflection hologram, in particular it is an object to increase the effective reconstruction efficiency of a total internal reflection hologram.

According to the invention there is provided a method for reconstructing an image from a total internal reflection hologram that includes the steps of arranging the hologram in relation to a first face of a coupling body;

generating a substantially collimated illumination beam;

directing the illumination beam through a second face of the coupling body so that it reconstructs the image recorded in the hologram;

recycling at least once the light in the illumination beam that does not reconstruct the imagine wherein the light reflected from the hologram is directed out of the coupling body through the second or a third face and is subsequently redirected as a recycled beam through the second face of the coupling body such that it also reconstructs the image recorded in the hologram;

scanning the illumination and recycled beams across the hologram.

The hologram is preferably arranged on a first surface of a transparent substrate such as a glass plate the other surface of which is brought into optical contact with the first face of the coupling body by way of a refractive index matching fluid. The coupling body preferably comprises a prism of a transparent material such as glass. A second and a third face of the prism are inclined relative to the first face in order that an illumination beam can be directed through the second face so that it reconstructs the image recorded in the hologram either directly or indirectly following reflection from another face or other faces of the prism and in order that the light reflected from the hologram leaves the prism through the second or the third face, either directly or indirectly. The coupling body may alternatively comprise a transparent substrate with a diffractive element of the type described in EP 98300188 on its second face whereby both the illumination beam and the beam reflected the hologram are coupled from and to the ambient by grating structures in the diffractive element. The hologram may alternatively be arranged directly on the first face of the coupling body by recording it in a photosensitive layer applied directly to that face.

Preferably the scanning comprises a sequence of alternating scan lines and scan steps as in a raster scan though other scanning schemes may be employed. In order that the images reconstructed by the illumination and recycled beams can be printed accurately and uniformly in focus onto a substrate using a technique such as that described in EP-A-0421645 it is desirable that the separation between the illumination and recycled beams at the hologram be minimised and that the continuous measurement of the separation of the hologram and substrate be determined at the midpoint of the beams. To further optimise the accuracy and uniformity of focus with which the images are printed onto the substrate, it is further desirable that the beam generation provides that the dimension of the illumination beam in the scanning direction be compressed relative to its dimension in the stepping direction, and that the recycling provides that the recycled beam at the hologram be spatially offset from the illumination beam in the scanning direction.

As the illumination beam scans across or along an edge of a pattern recorded in the hologram, the uniformity of intensity of the recycled beam will necessarily be degraded because the intensity of that part of the recycled beam reflected from outside of the pattern will be higher than that part of the beam reflected from inside of the pattern. This will give rise to a non-uniformity in the pattern printed from the hologram by the recycled beam which, depending on its magnitude, may be a problem. In order that the recycled beam provides a more uniform reconstruction of the image from the hologram the method of the invention may be enhanced by additionally inverting the recycled beam in the direction in which the illumination and recycled beams are offset. Thus, if the recycled beam is offset from the illumination beam in the direction of the scan lines, then the inversion should provide that the front of the recycled beam be derived from the back of the illumination beam, and vice versa. In this way the otherwise abrupt change in the time-integrated exposure energy density of the recycled beam reconstructing the hologram produced by the illumination beam traversing along or across an edge of the pattern recorded in the hologram is made gradual, and this allows it to be substantially or wholly eliminated by including the additional step of adjusting either the power, scanning speed or step size of the illumination beam as the illumination and recycled beams traverse the edge of the pattern.

In another embodiment the method of the invention includes spatially filtering the recycled beam before it reconstructs the image in the hologram so as to reduce or eliminate any optical noise introduced into beam by the reconstruction of the image from the hologram.

According to the invention there is also provided an apparatus for reconstructing an image from a total internal reflection hologram that includes:

a coupling body in relation to whose first face the hologram is arranged;

at least one light source for generating a light beam;

beam shaping optics for increasing the dimension of the light beam in at least one plane and for providing a substantially collimated illumination beam;

means for directing the illumination beam through a second face of the coupling body so that it reconstructs the image recorded in the hologram;

means for recycling at least once the light in the illumination beam that does not reconstruct the image wherein the light reflected from the hologram is directed out of the coupling body through the second or a third face and is subsequently redirected as a recycled beam through the second face of the coupling body so that it also reconstructs the image recorded in the hologram;

a means for scanning the illumination and recycled beams across the hologram.

Preferably the means for scanning the illumination and recycled beams is a single two-axis stage system that generates a two-dimensional scan pattern such as a raster scan composed of an alternating sequence of scan lines and orthogonal scan steps. Preferably the means for recycling the light provides that the illumination and recycled beams are spatially separated at the hologram and that their separation is minimised such that the images reconstructed therefrom can be printed accurately and uniformly in focus onto a substrate using, for example, the method described in EP-A-0421645. Advantageously the recycling means includes at least one optical element mounted to the scanning means that deflects the beam recycled from the coupling body so that it is directed parallel to the original illumination beam back through the second face of the coupling body to the hologram. The beam deflecting element may simply comprise a mirror that reflects the recycled beam such that is parallel and spatially offset from the original illumination beam, or it may comprise a pair of mirrors that additionally inverts the recycled beam in the direction in which the illumination and recycled beam are spatially offset. With such an inversion it is desirable that the apparatus additionally includes a means for adjusting the intensity, scanning speed or step size of the illumination beam for the purpose of enabling a uniform reconstruction of the image from the hologram at the edges of the hologram. The beam deflecting optical elements mounted to the scanning means may alternatively comprise a polarisation rotator and a polarising beamsplitter which combine the recycled beam with the original illumination beam so that the two are spatially superposed and collinear at the hologram.

DESCRIPTION OF THE DRAWINGS

For a more complete understanding of the present invention reference is now made to FIGS. 1–12 of the drawings.

DESCRIPTION OF THE PREFERRED EMBODIMENTS

Figure 1:
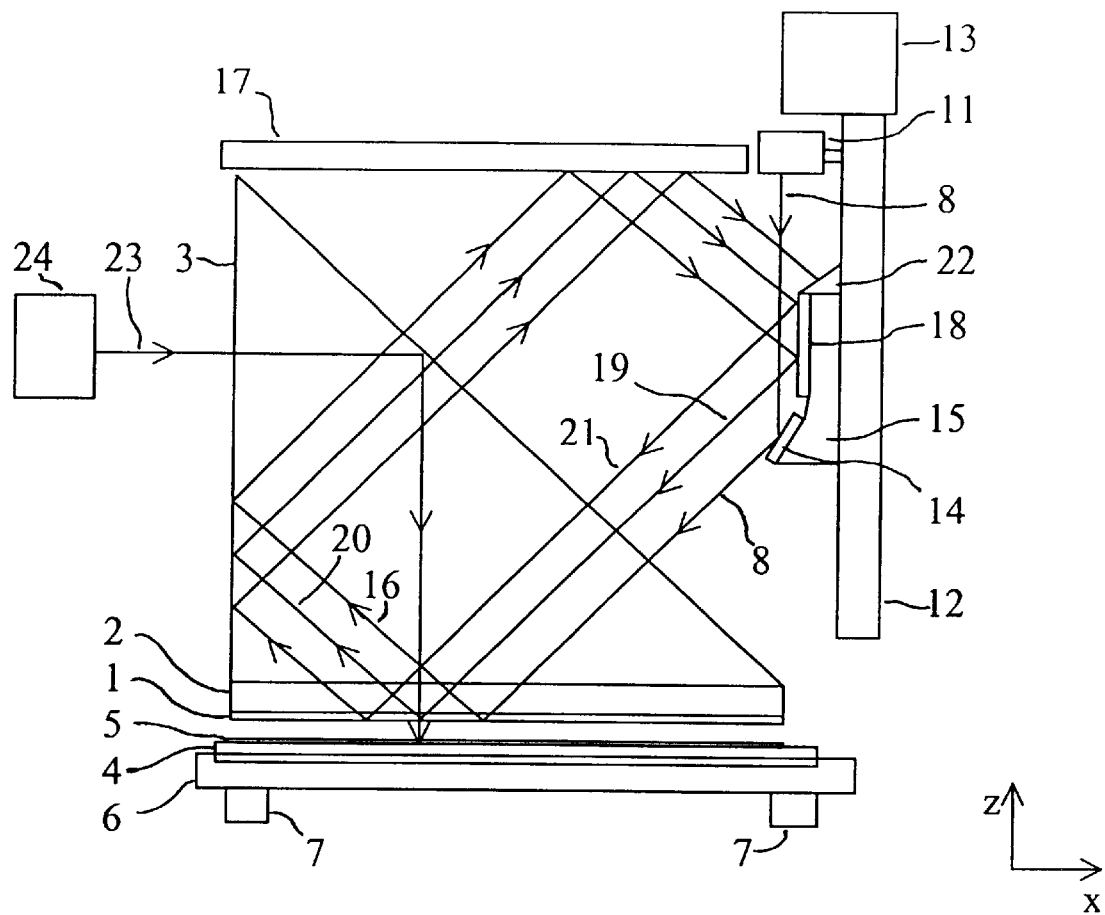
FIG. 1 is a schematic of a first embodiment of the present invention for reconstructing an image from a total internal reflection hologram by beam recirculation in which the light in the scanning illumination beam that does not reconstruct the image in the hologram is recycled twice by a large mirror arranged above a prism bearing the hologram and an additional small mirror on the 2-axis scanning stage.
Figure 2:
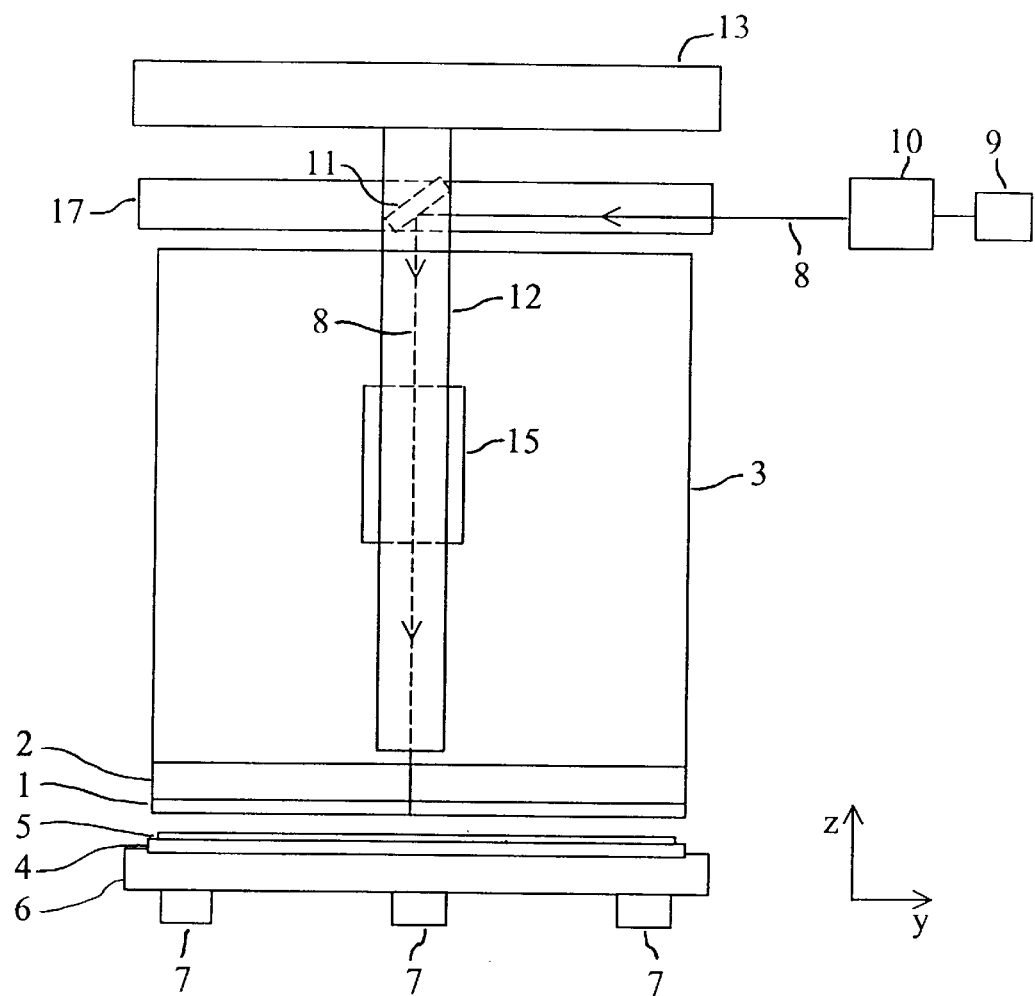
FIG. 2 is a side-view of the apparatus in FIG. 1 showing the configuration of the 2-axis scanning stage and the large mirror in relation to the prism and hologram.

FIGS. 1 and 2 show a novel arrangement for reconstructing an image from a TIR hologram according to the present invention. A glass substrate 2 with a TIR hologram 1 on its lower surface is put in optical contact by way of a refractive index matching fluid with the underside surface of a 45°, 45°, 90° glass prism 3. Below the hologram 1 is arranged a silicon wafer 4 which has been coated on its upper surface with a layer of photoresist 5. The wafer 4 is supported and held flat by a vacuum chuck 6 mounted to actuators 7 such as piezo-electric transducers or fine drives that accurately position the upper surface of the wafer 4 parallel to the hologram 1 and at a distance of ~100 μm it, this value corresponding to the focal distance of the image to be reconstructed from the hologram 1.

An illumination beam 8 derived from an argon ion laser 9 emitting at a wavelength of 363.8 nm and expanded by an anamorphic lens system 10 to produce a collimated beam of $1/e^2$ dimensions 15 mm×5 mm is incident on a first mirror 11 mounted to the y-axis carriage 12 of a 2-axis stage system 13. The mirror 11 reflects the beam vertically to a second mirror 14 mounted to the z-axis carriage 15 of the stage system 13 which reflects the beam towards the hypotenuse face of the prism 3 such that it illuminates the hologram 1 at an angle of incidence of 45°, this angle corresponding to that of the reference beam during the recording of the hologram 1 thereby ensuring that an aberration-free image is reconstructed from the hologram 1. A part of the light in the incident illumination beam 8 reconstructs an image onto the photoresist layer 5 and the remaining part of the light is reflected from the hologram as a beam 16 towards the vertical face of the prism 3 which totally internally reflects the light so that it passes out of the prism 3 through its hypotenuse face. A large mirror 17 arranged above the prism 3 reflects the beam 16 back to the z-axis carriage 15 of the scanning stage 13 where it is deflected by a small mirror 18 mounted thereto back towards the hypotenuse face of the prism 3 and the hologram 1. The mirror 18 is arranged such that the first recycled beam 19 reflected therefrom is parallel to the illumination beam 8 and is offset from it in the x-direction. A part of the light in this recycled beam 19 similarly reconstructs an image from the hologram 1 and the remainder is reflected as a beam 20 and recycled as before round to the small mirror 18 of the z-axis carriage 15 of the stage system 13 from where it is reflected again by the small mirror 18 to the hologram 1 as a second recycled beam 21. This second recycled beam 21 likewise partly reconstructs an image from the hologram 1 but the remaining light rather than being recycled to the hologram 1 is instead absorbed by an absorbing plate 22 mounted on the z-axis carriage 15 of the scanning stage 13.

Figure 3:
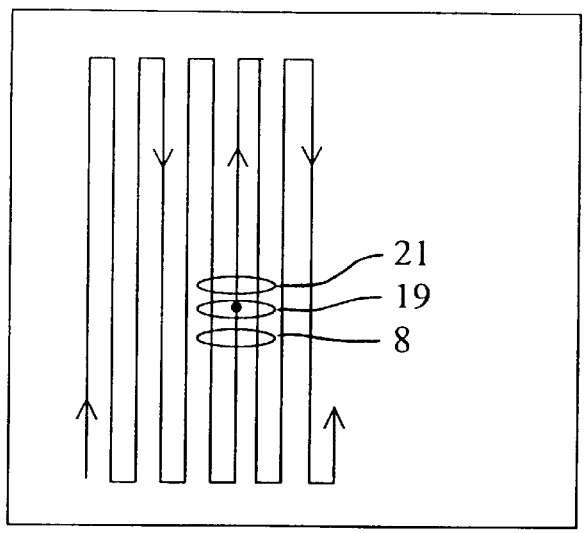
FIG. 3 shows the preferred spatial relationship, shapes and scan pattern in the plane of the hologram of the illumination and recycled beams of FIG. 1.

The two-axis scanning stage 13 generates a raster scan pattern comprising an alternating sequence of scan lines and scan steps of the illumination and recycled beams. FIG. 3 shows the path of the scanning beam across the hologram 1 in which successive scan lines overlap so that the time-integrated exposure energy across the hologram 1 is made uniform. The speed and step size of the beam in this raster pattern and the power of the laser beam are selected such that the total time-integrated energy density of the light in the reconstructed image corresponds to that required by the photoresist layer 5 on the wafer 4.

The elliptical shape of the scanning illumination and recycled beams 8, 19, 21 shown in FIG. 3 is produced by the anamorphic lens system 9 and their spatial relationship is determined by the configuration of the large and small mirrors 17 and 18. The elliptical shape and spatial relationship of the beams enable the reconstructed image to be printed accurately and uniformly in focus on the wafer 4 without sacrificing the exposure time, as is explained in more detail in European patent application 98303677. Referring again to FIG. 1, so that the reconstructed image is printed in focus on the surface of the wafer 4, a beam 23 from an interferometric measurement system 24 is employed to continuously measure the local separation of the hologram 1 and the wafer 4 at the mid-point of the three beams 8, 19, 21 as they scan the hologram 1. In response to these measurements, the actuators 7 displace the chuck 6 and wafer 4 vertically so that the local separation of the wafer 4 and hologram 1 at the midpoint of the illuminating beams 8, 19, 21 corresponds to the focal distance of the image reconstructed from the hologram 1.

Figure 4:
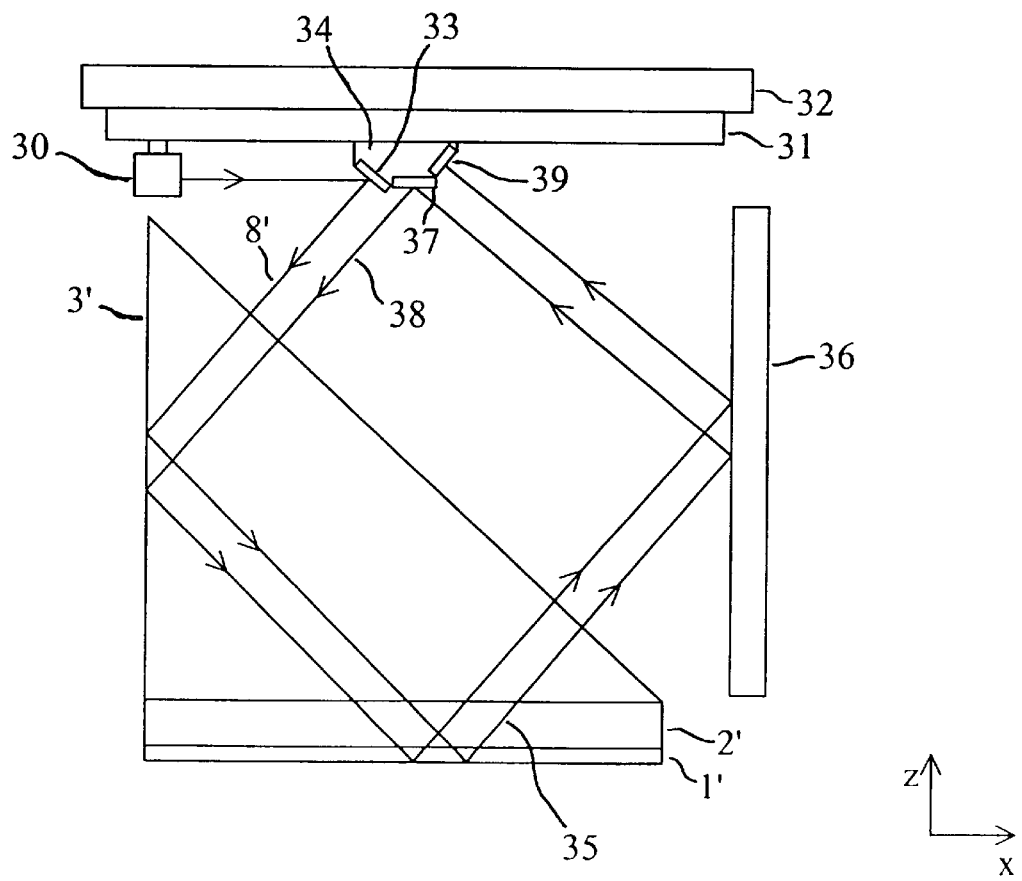
FIG. 4 shows an alternative embodiment of the present invention in which the positions of the scanning stage and large mirror in relation to the prism shown in FIGS. 1 and 2 have been interchanged.

FIG. 4 shows an alternative embodiment of the present invention in which the positions of the 2-axis scanning stage 13 and large mirror 17 shown in FIGS. 1 and 2 have been interchanged. In this configuration the illumination beam 8' from the laser and anamorphic lens system (not shown in the figure) is first reflected by a mirror 30 mounted to the y-axis carriage 31 of the 2-axis scanning stage system 32 and then by a mirror 33 mounted to the x-axis carriage 34 of the stage system 32 towards the prism 3'. After passing through the hypotenuse face of the prism 3' the beam 8' is totally internally reflected off the vertical face of the prism 3' to the hologram 1' on the lower surface of glass substrate 2'. The light that does not reconstruct an image from the hologram 1' is reflected as a beam 35 out of the prism 3' to a large mirror 36 which reflects it back to the x-axis carriage 34 of the scanning stage 32. A small mirror 37 on the x-axis carriage 34 reflects it to produce a recycled beam 38 travelling parallel to the original illumination beam 8' and offset from it in the x-direction. In this embodiment, and as an example, the illumination beam is recycled just the once before being absorbed by an absorber plate 39 mounted to the x-axis carriage 34 of the scanning stage 32. The wafer and chuck system 4–7 and the interferometer measurement system 24 that are shown in FIG. 1 are similarly present in the embodiment illustrated in FIG. 4 though have been omitted from the figure.

Figure 5:
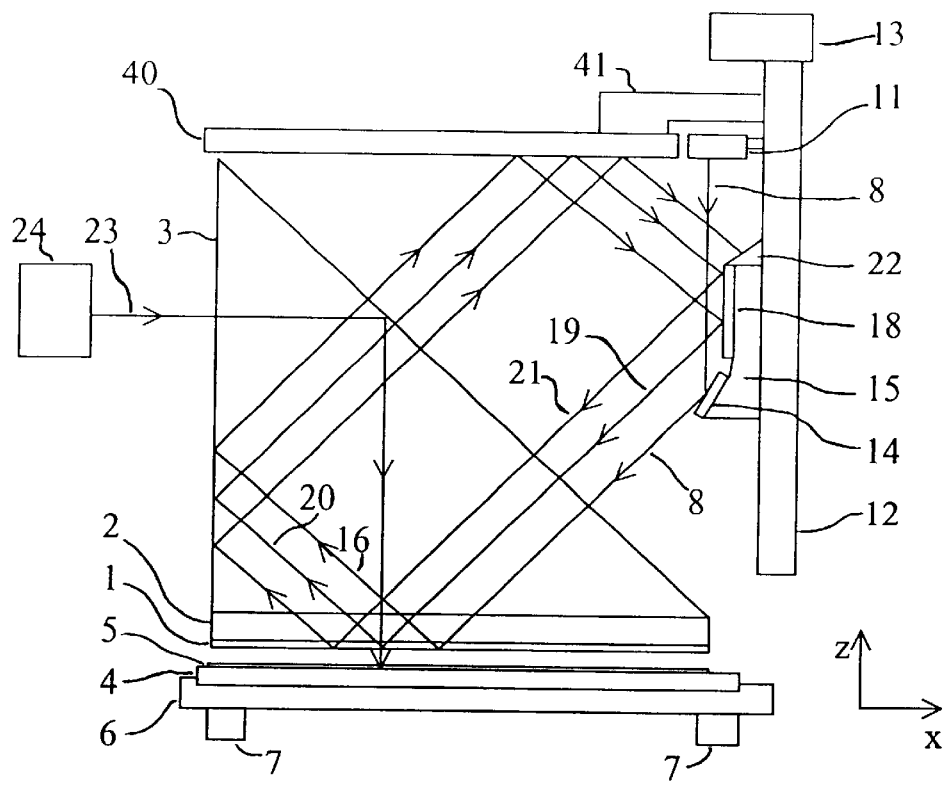
FIG. 5 shows another embodiment in which the large mirror of FIGS. 1 and 2 has been replaced by a long and narrow mirror that is additionally mounted to the y-axis carriage of the 2-axis scanning stage.
Figure 6:
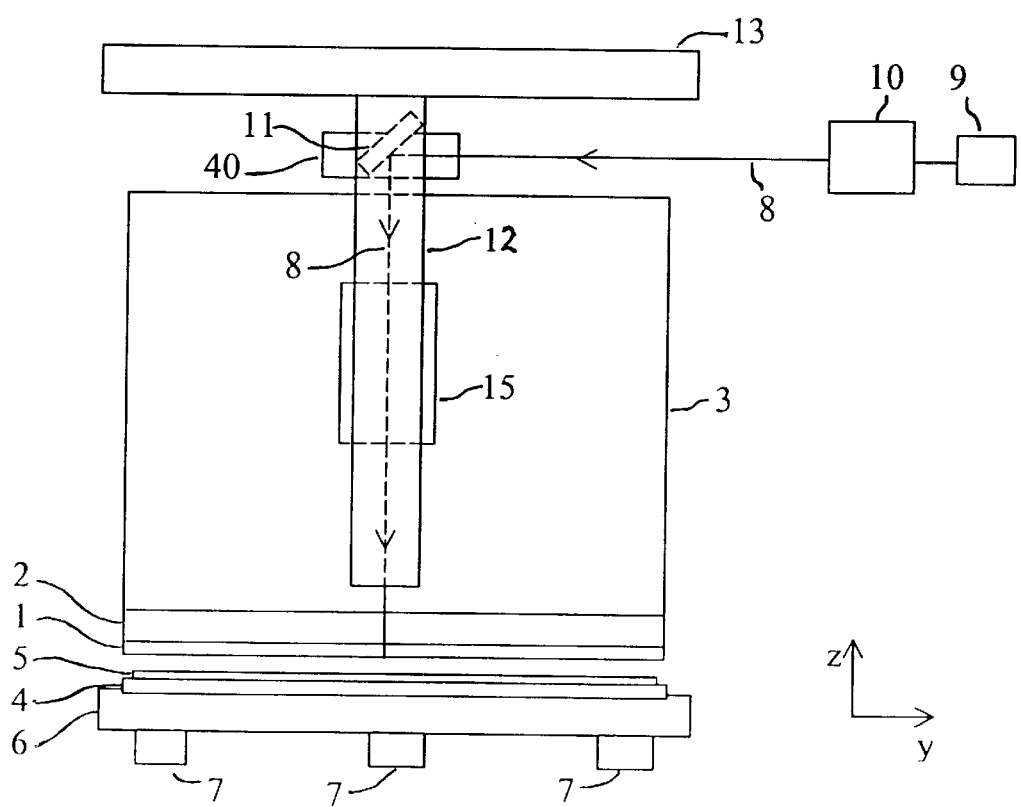
FIG. 6 shows a side view of the apparatus in FIG. 5.

FIGS. 5 and 6 show another embodiment which is the same as that shown in FIGS. 1 and 2 except that the large fixed mirror 17 in FIG. 1 has been replaced by a mirror 40 that is long in the x direction but narrow in the y direction and which is mounted by a mounting part 41 to the y-axis carriage 12 of the 2-axis stage system 13. Optically this configuration produces the same effect as that shown in FIGS. 1 and 2 but it offers certain mechanical advantages.

In other embodiments the beam shaping optics and recycling means can be arranged such that the raster scan pattern produced by the embodiments shown in FIGS. 1–6 is rotated by 90° with respect to the hologram so that the scan lines are instead in the y direction and the scan steps are in the x-direction.

Clearly, other embodiments of the invention may recycle the beam several or more times in order to maximise the use of the laser power available. Also, although the embodiments illustrated in FIGS. 1–6 are limited to a coupling body in the form of a 45°, 45°, 90° triangular prism in which the beam is coupled into and out of the prism by the same hypotenuse face, other triangular and polygonal prisms can also be envisaged that would allow firstly the angle of incidence of the illumination and recycled beams at the hologram to satisfy the condition necessary for an accurate reconstruction of the image recorded therein and secondly would allow the light reflected from the hologram to exit the prism.

Figure 7:
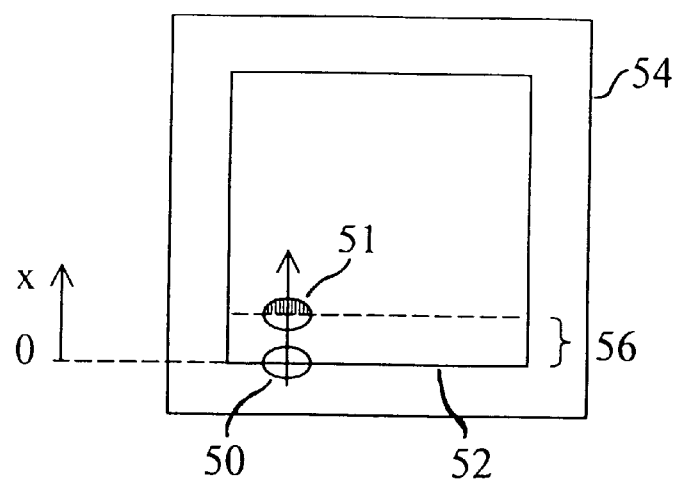
FIG. 7 illustrates the problem of non-uniform exposure of the hologram by the recycled beam caused by the illumination beam traversing an edge of the pattern in the hologram.

An imperfection of the embodiments described in FIGS. 1–6 is that the time-integrated exposure density produced by the recycled beams is not uniform at the edge of the hologram. This can be understood from consideration of FIG. 7 which shows an illumination beam 50 and a recycled beam 51 as the illumination beam 50 scans across the edge of the hologram 52 recorded on the substrate 54. Because that part of the illumination beam 50 inside the edge of the hologram 52 is reconstructing an image whereas that part of the beam outside the edge of the hologram 52 is not, the intensity of the leading part of the recycled beam 51 will be less than that of the trailing part. Clearly as the illumination beam 50 scans across the edge of the hologram 52 the division between the more and less intense parts of the recycled beam 51 remains stationary with respect to the edge of the hologram 52 and therefore a strip of the image 56 reconstructed along that edge of the hologram will have a higher intensity.

Figure 8:
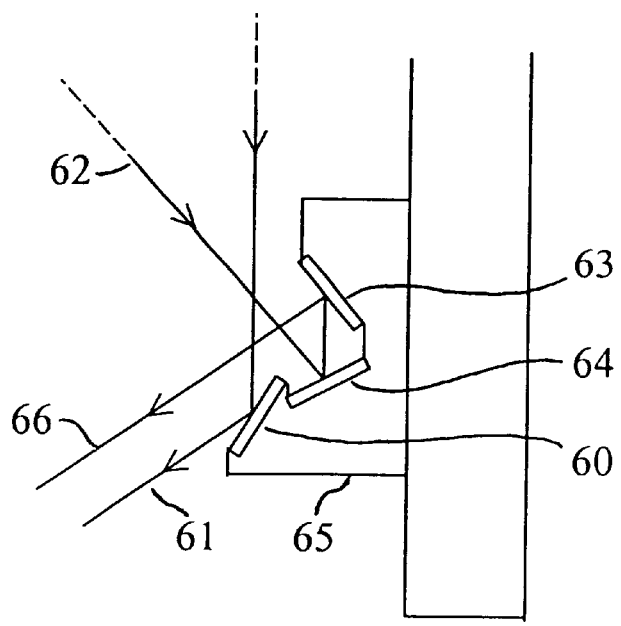
FIG. 8 shows an alternative arrangement of mirrors in the scanning head that inverts the recycled beam.
Figure 9:
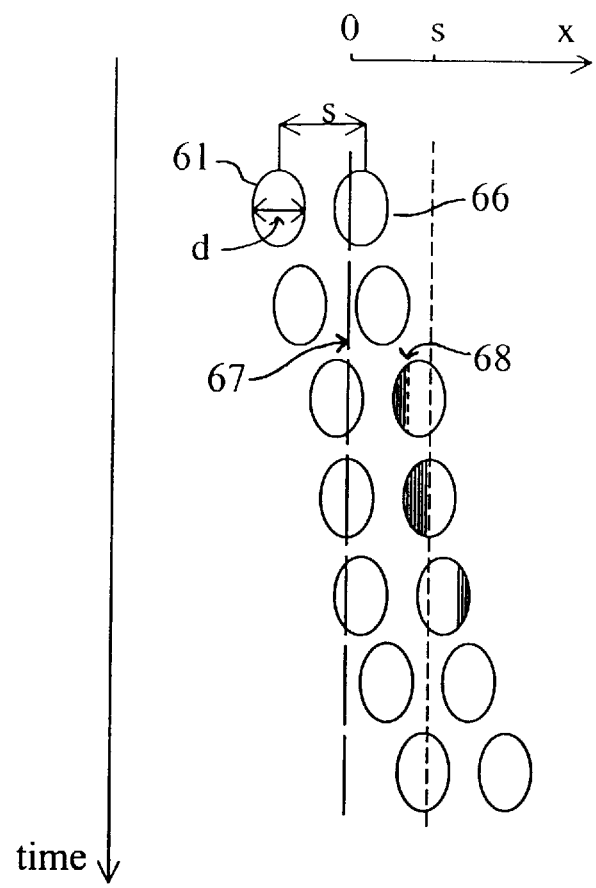
FIG. 9 illustrates the intensity distributions within the incident and recycled beams in the plane of the hologram generated by the scanning head depicted in FIG. 8 as the beams traverse the edge of the pattern recorded in the hologram.
Figure 10:
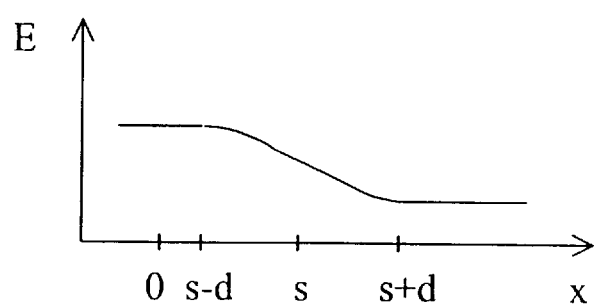
FIG. 10 shows the spatial variation of the time-integrated exposure energy density of the recycled beam in the scanning direction at the edge of the pattern in the hologram produced by recycling with an inverted beam.
Figure 11:
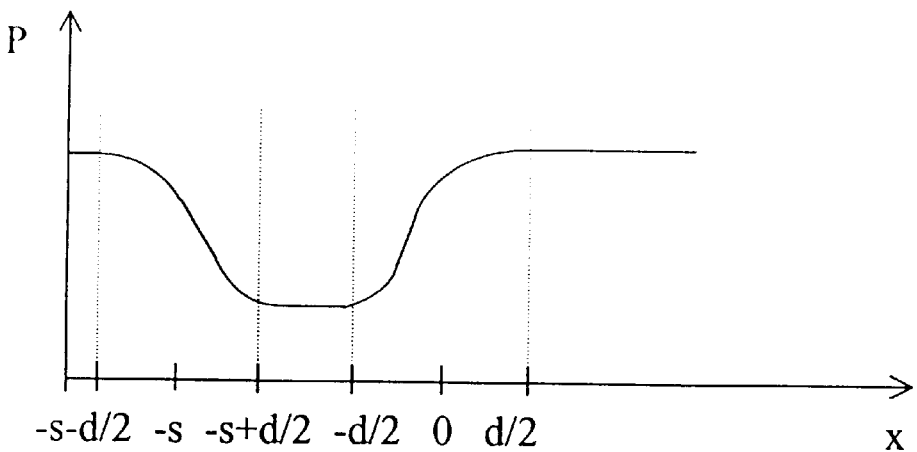
FIG. 11 illustrates the adjustment needed to the power of the illumination beam as the illumination and recycled beams of FIG. 9 scan across the edge of the pattern recorded in the hologram in order that the time-integrated exposure density of the hologram is made substantially uniform.

This non-uniformity may be overcome by including a dummy pattern along the corresponding edge of the pattern in the mask from which the hologram is recorded so that the strip of the image reconstructed with higher intensity lies outside of the main pattern. This solution, however, would result in the dummy pattern also being reconstructed which for certain applications may also be undesirable. A preferred solution is instead to invert the recycled beam in the direction in which it is offset from the illumination beam. This can be achieved using the more complex design for the scanning head shown in FIG. 8 in which the beam 62 returning from the hologram for recycling is reflected by a pair of mirrors 63 and 64 mounted to the z-axis carriage 65, or scanning head, of the scanning stage. The inverted beam 66 returns to the prism parallel and offset to the original illumination beam 61 reflected from mirror 60. FIG. 9 shows a time sequence of the resulting intensity distributions within the illumination and recycled beams 61 and 66 as they traverse the edge of the hologram 67. In this case it can be seen that the division 68 between the more and less intense parts of the recycled beam 66 displaces relative to the edge of the hologram 67 as the illumination beam 61 traverses it. The resulting time-integrated exposure energy, E, of the recycled beam 66 at the edge of the hologram as a function of the x-coordinate is shown in FIG. 10 with the x-coordinate being expressed in terms of the beams' width in the x direction, d, and the separation, s, between the centres of the illumination and recycled beams. Such a variation can be substantially if not entirely eliminated by adjusting either the power or the scan speed of the illumination beam as the beam traverses the edge of the hologram 67. Since such an adjustment introduces a non-uniformity into the time-integrated energy density of the original illumination beam 61 it is further necessary to adjust the power or scanning speed of the illumination beam 61 as the recycled beam 66 traverses the edge of the hologram 67. FIG. 11 illustrates schematically the adjustment of the laser power, P, needed to achieve high uniformity wherein the x co-ordinate represents the position of the centre of the illumination beam 61 relative to the edge of the hologram 67 expressed in terms of width of the beam, d, and the separation of the beams, s.

Figure 12:
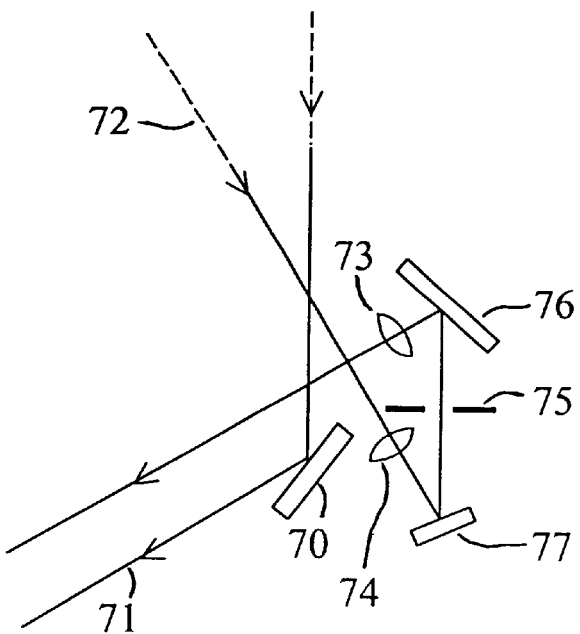
FIG. 12 shows an alternative optical design for the scanning head that includes spatial filtering optics to eliminate optical noise.

FIG. 12 shows schematically an alternative optical design for the scanning head which spatially filters the recycled beam 72 to reduce or eliminate optical noise introduced into the beam by the holographic reconstruction. A first lens 74 focuses the beam 72 via a mirror 77 onto a pinhole 75 which eliminates any optical noise from the recycled beam 72. The filtered beam is the reflected by a second mirror 76 and recollimated by a second lens 73 after which it returns to the hologram parallel and offset to the original illumination beam 71 reflected from mirror 70.

The effects of intensity non-uniformities introduced into the recycled beam(s) by the holographic reconstruction may also be reduced by adding an orthogonal oscillatory component to the motion of the scanning beams whose amplitude is small compared to the dimension of the beam in the stepping direction yet whose frequency is high enough that time-integration averages out the intensity non-uniformities. Such an oscillation (or equivalent motion) may be generated by the same scanning stages or by additional opto-mechanical means.

Figure 13:
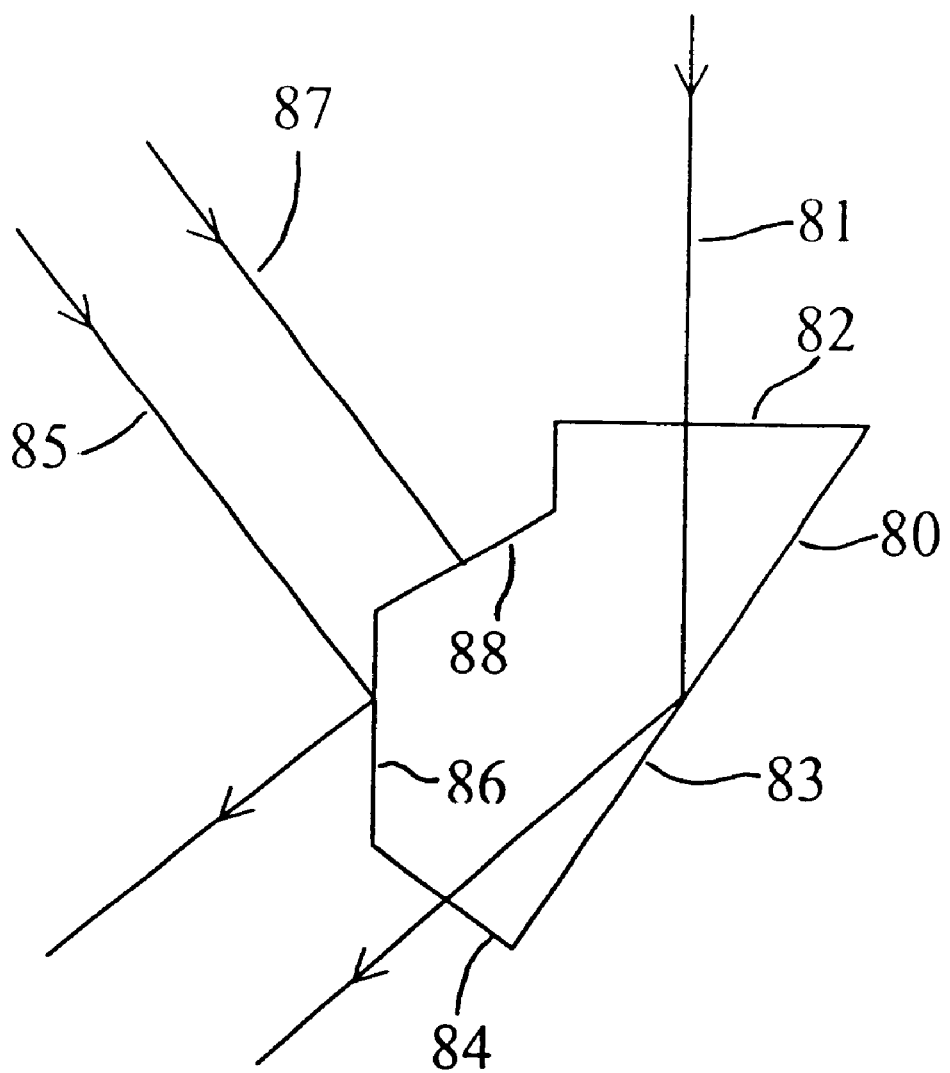
FIG. 13 shows another example of the scanning head.

FIG. 13 shows a further example of the scanning head which comprises a multi-faceted block 80 of a transparent material such as fused silica. With this arrangement, the beam 81 from the scanning system passes through an entrance face of the block 82 which preferably bears an anti-reflection coating, and is incident on an oblique face of the block 83 from which it is totally internally reflected. The beam then leaves the block 80 through the exit face 84 also preferably bearing an anti-reflection coating and passes to the hologram. The recycled beam 85 returning from the hologram is incident on a face of the block 86 which has been coated to provide high reflectance, and the reflected beam re-illuminates the hologram. The beam 87 returning from the hologram is incident on and absorbed by an absorbing material or materials applied to the face of the block 88. A more elaborate version of this embodiment would additionally provide that the heat generated by this absorption was removed from the scanning head.

In a further embodiment the mirror 37 shown in FIG. 4 is mounted onto fine drives which allow a fine and controlled deflection of the recycled beam 38 in the xz plane such that the image instantaneously reconstructed from the hologram 1 by the illumination and recycled beams 8' and 38 can be essentially expanded by a known amount in the x-direction. With this modification the scale of a pattern reconstructed by the illumination and recycled beams can be changed using the techniques disclosed in U.S. Pat. No. 5,695,894.

In yet another embodiment, the light in the illumination beam that does not reconstruct the image from the hologram but is instead reflected from the hologram and directed out of the coupling body and then passes back through the coupling body before it is subsequently redirected through the second face of the coupling body to reconstruct the hologram.

What is claimed is:

1. A method for reconstructing an image from a total internal reflection hologram that includes the steps of:
   a) arranging the hologram in relation to the first face of a coupling body;
   b) generating a substantially collimated illumination beam;
   c) directing the illumination beam through a second face of the coupling body so that it reconstructs the image recorded in the hologram;
   d) recycling at least once the light in the illumination beam that does not reconstruct the image wherein the light reflected from the hologram is directed out of the coupling body through the second or a third face and is subsequently redirected as a recycled beam through the second face of the coupling body such that it also reconstructs the image recorded in the hologram;
   e) scanning the illumination and recycled beams across the hologram.

2. A method according to claim 1 wherein the hologram is arranged on the first surface of a transparent substrate whose second surface is brought into optical compact with the first face of the coupling body by way of refractive index matching fluid.

3. A method according to claim 1 wherein the hologram is arranged directly on the first face of the coupling body.

4. A method according to claim 1 wherein the recycled beam or beams is/are redirected through the second face of the coupling body so that the illumination and recycled beams are spatially separated at the hologram.

5. A method according to claim 4 wherein the illumination and recycled beams at the hologram are spatially separated in the direction in which they are scanning.

6. A method according to claim 5 which additionally includes inverting the recycled beam in the direction of scanning such that the front of the recycled beam is derived from the back of the illumination beam and vice versa.

7. A method according to claim 5 wherein the intensity of the illumination beam is adjusted as the illumination and recycled beams traverses an edge of the pattern recorded in the hologram in order that the time-integrated exposure density is made substantially uniform.

8. A method according to claim 1 wherein the recycled beam is spatially filtered before it reconstructs the hologram.

9. A method according to claim 1 wherein the illumination and recycled beams are collinear and superposed at the hologram.

10. A method according to claim 1 wherein the illumination and recycled beams scan across the hologram in a raster pattern.

11. A method according to claim 1 wherein the light directed out of the coupling body through the second or a third face is directed back through the coupling body and out of it before it is subsequently redirected as a recycled beam through the second face to reconstruct the image recorded in the hologram.

12. An apparatus for reconstructing an image from a total internal reflection hologram that comprises:
   a) a coupling body in relation to whose first face the hologram is arranged;
   b) at least one light source for generating a light beam;
   c) beam shaping optics for increasing the dimension of the light beam in at least one plane to produce a substantially collimated illumination beam;
   d) means for directing the illumination beam through a second face of the coupling body so that it reconstructs the image recorded in the hologram;

e) means for recycling at least once the light in the illumination beam that does not reconstruct the image wherein the light reflected from the hologram is directed out the coupling body through the second or a third face and is subsequently redirected through the second face of the coupling body such that it reconstructs the also image recorded in the hologram;

f) a means for scanning the illumination and recycled beams across the hologram.

13. An apparatus according to claim 12 wherein the hologram is arranged on the first surface of a glass substrate whose second surface is brought into optical contact with the first face of the coupling body by way of a refractive index matching fluid.

14. An apparatus according to claim 12, wherein the means for directing the recycled beam or beams through the second face of the coupling body provides that the illumination and recycled beams are spatially separated at the hologram.

15. An apparatus according to claim 12, wherein the means for directing the recycled beam or beams through the second face of the coupling body provides that the illumination and recycled beams are spatially separated at the hologram.

16. An apparatus according to claim 12 which additionally includes means for inverting the first recycled beam in the direction of scanning so that the front of the recycled beam is derived from the back of the illumination beam and vice versa.

17. An apparatus according to claim 12 which additionally includes a spatial filter for eliminating optical noise from the recycled beam before it reconstructs the hologram.

18. An apparatus according to claim 12 wherein the means for the recycling the beam includes a polarisation rotator and a polarising beamsplitter that combine the recycled beam with the illumination beam such that they are superposed and collinear at the hologram.

19. An apparatus according to claim 12 wherein the means for directing the illumination beam to the hologram includes a third or fourth face of the coupling body from which the beam is totally internally reflected.

20. An apparatus according to claim 12 wherein the means for recycling the light includes a third or fourth face of the coupling body from which the light reflected from the hologram is totally internally reflected before it leaves the coupling body.

21. An apparatus according to claim 12 wherein the means for recycling the light from the second or third face of the coupling body back to the second face of the coupling body is wholly mounted to the scanning means.

22. An apparatus according to claim 12 wherein the means for scanning the illumination and recycled beams generates a raster scan pattern.

* * * * *